United States Patent
Na et al.

(10) Patent No.: US 9,531,375 B2
(45) Date of Patent: Dec. 27, 2016

(54) RADIO FREQUENCY SWITCH CIRCUIT

(71) Applicant: SAMSUNG ELECTRO-MECHANICS CO., LTD., Suwon-Si, Gyeonggi-Do (KR)

(72) Inventors: Yoo Sam Na, Suwon-Si (KR); Jong Myeong Kim, Suwon-Si (KR); Yoo Hwan Kim, Suwon-Si (KR); Hyun Hwan Yoo, Suwon-Si (KR); Dae Seok Jang, Suwon-Si (KR); Hyun Jin Yoo, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 65 days.

(21) Appl. No.: 14/609,297

(22) Filed: Jan. 29, 2015

(65) Prior Publication Data

US 2016/0049931 A1    Feb. 18, 2016

(30) Foreign Application Priority Data

Aug. 14, 2014   (KR) .................. 10-2014-0106124

(51) Int. Cl.
| | | |
|---|---|---|
| *H03K 17/687* | (2006.01) | |
| *H03K 17/06* | (2006.01) | |
| *H03K 17/693* | (2006.01) | |

(52) U.S. Cl.
CPC .......... *H03K 17/687* (2013.01); *H03K 17/063* (2013.01); *H03K 17/693* (2013.01); *H03K 2017/066* (2013.01)

(58) Field of Classification Search
CPC .. H03K 17/002; H03K 17/063; H03K 17/066; H03K 17/6871; H03K 17/693; H03K 17/735

See application file for complete search history.

(56) References Cited

U.S. PATENT DOCUMENTS 5,548,239 A * 8/1996 Kohama ............... H04B 1/44
                                        327/408
8,970,279 B2 * 3/2015 Ha ....................... H03K 17/16
                                        327/308

(Continued)

FOREIGN PATENT DOCUMENTS

| JP | 2007-259112 A | 10/2007 |
|---|---|---|
| JP | 2012-080187 A | 4/2012 |
| KR | 10-2014-0066453 A | 6/2014 |

OTHER PUBLICATIONS

Korean Office Action issued on Nov. 20, 2015 in counterpart Korean Application No. 10-2014-0106124 (12 pages in English; 9 pages in Korean).

*Primary Examiner* — Thomas J Hiltunen
(74) *Attorney, Agent, or Firm* — NSIP Law

(57) ABSTRACT

A radio frequency switch circuit may include: a first switch circuit unit connected between a first signal port for transmitting and receiving a signal and a common connection node and operated by a first gate signal; a second switch circuit unit connected between a second signal port for transmitting and receiving a signal and the common connection node and operated by a second gate signal; a first shunt circuit unit including first and second shunt units connected to each other in series between a first connection node connected to the first signal port and a ground, the first shunt unit being operated by the first gate signal and the second shunt unit being operated by the second gate signal; and a second shunt circuit unit connected between a second connection node connected to the second signal port and the ground and operated by the first gate signal.

15 Claims, 4 Drawing Sheets

(56) References Cited

U.S. PATENT DOCUMENTS

| | | | |
|---|---|---|---|
| 8,970,282 B2* | 3/2015 | Jeong | H03K 17/00 |
| | | | 327/308 |
| 8,975,950 B2* | 3/2015 | Madan | H03K 17/162 |
| | | | 327/434 |
| 2012/0081262 A1 | 4/2012 | Tanaka et al. | |
| 2013/0072134 A1* | 3/2013 | Goto | H04B 1/109 |
| | | | 455/78 |
| 2014/0049312 A1* | 2/2014 | Chih-Sheng | H03K 17/693 |
| | | | 327/427 |
| 2014/0145776 A1 | 5/2014 | Jeong | |
| 2016/0020816 A1* | 1/2016 | Lee | H04B 1/44 |
| | | | 455/78 |

* cited by examiner

RADIO FREQUENCY SWITCH CIRCUIT

CROSS-REFERENCE TO RELATED APPLICATION

This application claims the benefit of Korean Patent Application No. 10-2014-0106124 filed on Aug. 14, 2014, with the Korean Intellectual Property Office, the disclosure of which is incorporated herein by reference.

BACKGROUND

The present disclosure relates to a radio frequency switch circuit that may be applied to a communications system.

Generally, a semiconductor integrated circuit embedded in a communications system includes a radio frequency switch circuit controlling a transfer path of a radio frequency signal between an antenna and a transmitting unit/receiving unit.

The radio frequency switch circuit may be used in communications systems, such as Bluetooth, cellular personal communications services (PCS), code division multiple access (CDMA), wideband code division multiple access (WCDMA), time division multiple access (TDMA), global system/standard for mobile communications (GSM), and the like, as well as a wireless local area network (WLAN).

Usually, the radio frequency switch circuit may be used between a transmitting unit and a receiving unit in various communications systems using time-division multiplexing (TDM). Since the transmitting unit and the receiving unit are alternately turned on and turned off by using the radio frequency switch circuit, overall power consumption of a communication system may be decreased, and interference between the transmitting unit and the receiving unit may also be decreased.

An existing radio frequency switch circuit may include a switch circuit unit connected between each radio frequency port and an antenna port and a shunt circuit unit connected between each radio frequency port and a ground in order to switch a transfer path of a radio frequency signal between each radio frequency port and the antenna port.

Here, the switch circuit unit may include a transmit switch circuit unit Tx SW and a receive switch circuit unit Rx SW, wherein each of the transmit switch circuit unit and the receive switch circuit unit may include a plurality of semiconductor switches.

In the existing radio frequency switch circuit, the switch circuit unit has a structure in which a plurality of transistors are stacked in order to prepare against application of a signal having a higher level than a breakdown voltage of a single transistor.

In the structure in which the plurality of transistors are stacked, since a high voltage higher than a rated voltage is divided and applied to each of the plurality of transistors, a voltage applied to one transistor becomes low, such that the transistor may be protected from the high voltage.

In the existing radio frequency switch circuit as described above, a gate signal Vg lower or higher than a threshold voltage Vth of a transistor is provided to gates of each of the transistors included in the transmit switch circuit unit and the receive switch circuit unit, such that the transistors may be controlled in a turned-on state or a turned-off state. This gate signal may be provided from a base band chipset.

Each of the switch circuit unit and the shunt circuit unit of the existing radio frequency switch circuit has used an N-channel metal oxide semiconductor (NMOS) transistor having relatively excellent electron mobility.

However, a breakdown voltage of a 0.18 μm NMOS transistor is 3.5V, and in the case in which the 0.18 μm NMOS transistor is used as a switch as in the radio frequency switch circuit, several NMOS transistors may be stacked in a stack structure in order to withstand high power of the GSM. For example, since the shunt circuit unit has signal power of 24V as a peak voltage Vpeak in an output of 35 dBm, about eight stacked NMOS transistors should be connected to each other in series in order to appropriately disperse a voltage. As the number of stacked NMOS transistors increases as described above, loss on a signal path increases, such that overall performance of the switch is deteriorated.

A need exists for providing a radio frequency switch which decreases signal loss by decreasing the number of stacked semiconductor switches in a shunt circuit.

SUMMARY

An exemplary embodiment in the present disclosure may provide a radio frequency switch circuit capable of decreasing signal loss by decreasing the number of stacked semiconductor switches in a shunt circuit unit.

According to an exemplary embodiment in the present disclosure, a radio frequency switch circuit may include: a first switch circuit unit connected between a first signal port for transmitting and receiving a signal and a common connection node connected to an antenna port and operated by a first gate signal; a second switch circuit unit connected between a second signal port for transmitting and receiving a signal and the common connection node and operated by a second gate signal; a first shunt circuit unit including first and second shunt units connected to each other in series between a first connection node connected to the first signal port and a ground, the first shunt unit being operated by the first gate signal and the second shunt unit being operated by the second gate signal; and a second shunt circuit unit connected between a second connection node connected to the second signal port and the ground and operated by the first gate signal, wherein the first and second shunt units are in a turned-off state when the first switch circuit unit is in a turned-on state and are in a turned-on state when the first switch circuit unit is in a turned-off state.

According to another exemplary embodiment in the present disclosure, a radio frequency switch circuit may include: a first switch circuit unit connected between a first signal port for transmitting and receiving a signal and a common connection node connected to an antenna port and operated by a first gate signal; a second switch circuit unit connected between a second signal port for transmitting and receiving a signal and the common connection node and operated by a second gate signal; a first shunt circuit unit including first and second shunt units connected to each other in series between a first connection node connected to the first signal port and a ground, the first shunt unit being operated by the first gate signal and the second shunt unit being operated by the second gate signal; and a second shunt circuit unit including third and fourth shunt units connected to each other in series between a second connection node connected to the second signal port and the ground, the third shunt unit being operated by the second gate signal and the fourth shunt unit being operated by the first gate signal, wherein the first and second shunt units are in a turned-off state when the first switch circuit unit is in a turned-on state and are in a turned-on state when the first switch circuit unit is in a turned-off state, and the third and fourth shunt units are in a turned-off state when the second switch circuit unit is in a turned-on state and are in a turned-on state when the second switch circuit unit is in a turned-off state.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
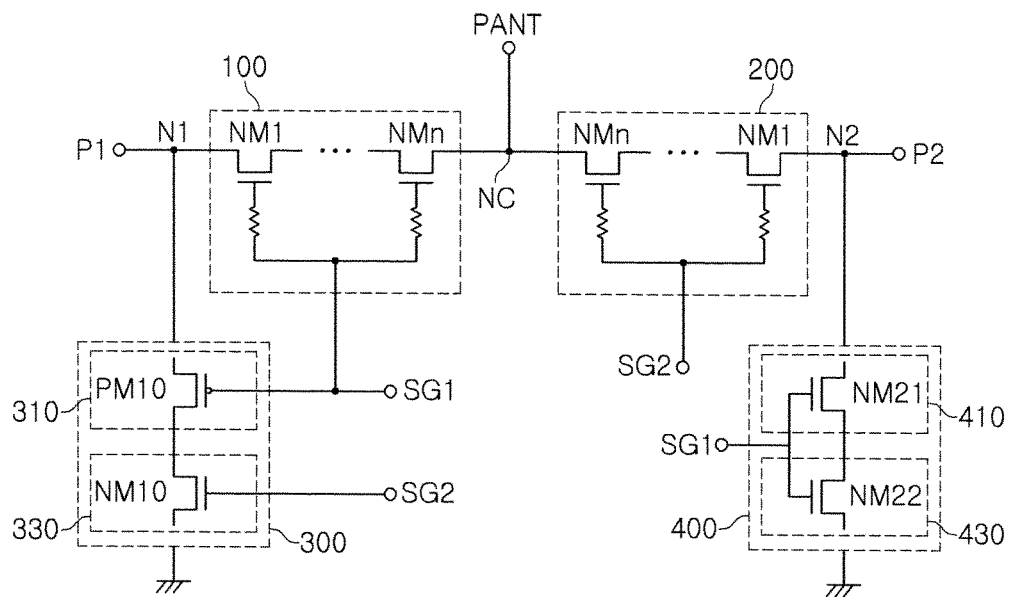
FIG. 1 is a diagram showing a configuration of a radio frequency switch circuit according to a first embodiment of the present disclosure.

Hereinafter, embodiments in the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

Throughout the drawings, the same or like reference numerals will be used to designate the same or like elements.

FIG. 1 is a diagram showing a configuration of a radio frequency switch circuit according to a first embodiment of the present disclosure.

Referring to FIG. 1, a radio frequency switch circuit according to the first exemplary embodiment of the present disclosure may include a first switch circuit unit 100, a second switch circuit unit 200, a first shunt circuit unit 300, and a second shunt circuit unit 400.

The first switch circuit unit 100 may be connected between a first signal port P1 for transmitting and receiving a signal and a common connection node NC connected to an antenna port PANT and be operated by a first gate signal SG1.

For example, the first switch circuit unit 100 may include a plurality of N-channel metal oxide semiconductor (NMOS) transistors NM1 to NMn connected to each other in series between the first signal port P1 and the common connection node NC and receiving the first gate signal SG1.

The second switch circuit unit 200 may be connected between a second signal port P2 for transmitting and receiving a signal and the common connection node NC and be operated by a second gate signal SG2.

For example, the second switch circuit unit 200 may include a plurality of NMOS transistors NM1 to NMn connected to each other in series between the second signal port P2 and the common connection node NC and receiving the second gate signal SG2.

The first gate signal SG1 and the second gate signal SG2 may be signals that do not have a high level at the same time. When the first gate signal SG1 is in a high level state that may allow a MOS transistor to be in a turned-on state, the second gate signal SG2 may be at least in a low level that may allow a MOS transistor to be in a turned-off state. In addition, the second gate signal SG2 is in a high level state that may allow the MOS transistor to be in a turned-on state, the first gate signal SG1 may be at least in a low level that may allow the MOS transistor to be in a turned-off state. The above-mentioned description may be applied to each exemplary embodiment of the present disclosure.

The first gate signal SG1 may be supplied to gates of each of the plurality of NMOS transistors NM1 to NMn of the first switch circuit unit 100 described above through resistors, and the second gate signal SG2 may be supplied to gates of each of the plurality of NMOS transistors NM1 to NMn of the second switch circuit unit 200 through resistors. Here, the resistors may provide impedances for an open state in alternating current (AC) and a ground state in direct current (DC). The above-mentioned description may be applied to each exemplary embodiment of the present disclosure.

The first shunt circuit unit 300 may be connected between a first connection node N1 connected to the first signal port P1 and a ground and be operated by the first and second gate signals SG1 and SG2. The first shunt circuit unit 300 may include first and second shunt units 310 and 330 connected to each other in series between the first connection node N1 connected to the first signal port P1 and the ground.

Here, the first shunt unit 310 may be operated by the first gate signal SG1, and the second shunt unit 330 may be operated by the second gate signal SG2. Here, each of the first and second shunt units 310 and 330 may be in a turned-off state when the first switch circuit unit 100 is in a turned-on state and may be in a turned-on state when the first switch circuit unit 100 is in a turned-off state.

For example, the first shunt unit 310 may include at least one P-channel MOS (PMOS) transistor PM10 connected between the first connection node N1 and the second shunt unit 330 and receiving the first gate signal SG1.

The second shunt unit 330 of the first shunt circuit unit 300 may include at least one NMOS transistor NM10 connected between the first shunt unit 310 and the ground and receiving the second gate signal SG2.

As another example, the second shunt unit 330 may include at least one NMOS transistor NM10 connected between the first connection node N1 and the first shunt unit 310 and receiving the second gate signal SG2.

The first shunt unit 310 may include at least one PMOS transistor PM10 connected between the second shunt unit 330 and the ground and receiving the first gate signal SG1.

Here, the PMOS transistor of the first shunt unit 310 may have a size larger than that of the NMOS transistor of the second shunt unit 330 in consideration of the fact that electron mobility of the PMOS transistor is relatively lower than that of the NMOS transistor.

The second shunt circuit unit 400 may be connected between a second connection node N2 connected to the second signal port P2 and the ground and be operated by the first gate signal SG1. For example, the second shunt circuit unit 400 may include at least two NMOS transistors NM21 and NM22 connected to each other in series between the connection node N2 and the ground.

Meanwhile, in the case in which the radio frequency switch circuit according to an exemplary embodiment in the present disclosure is applied to a time division system, the first signal port P1 may be a receiving port and the second signal port P2 may be a transmitting port, and vice versa.

Alternatively, in the case in which the radio frequency switch circuit according to an exemplary embodiment in the present disclosure is applied to a dual band system, the first signal port P1 may be a receiving and transmitting port and the second signal port P2 may be a receiving and transmitting port.

As described above, the radio frequency switch circuit according to an exemplary embodiment in the present disclosure is not limited to being applied to a specific communications system such as a specific time division communications system or a dual band system.

Figure 2:
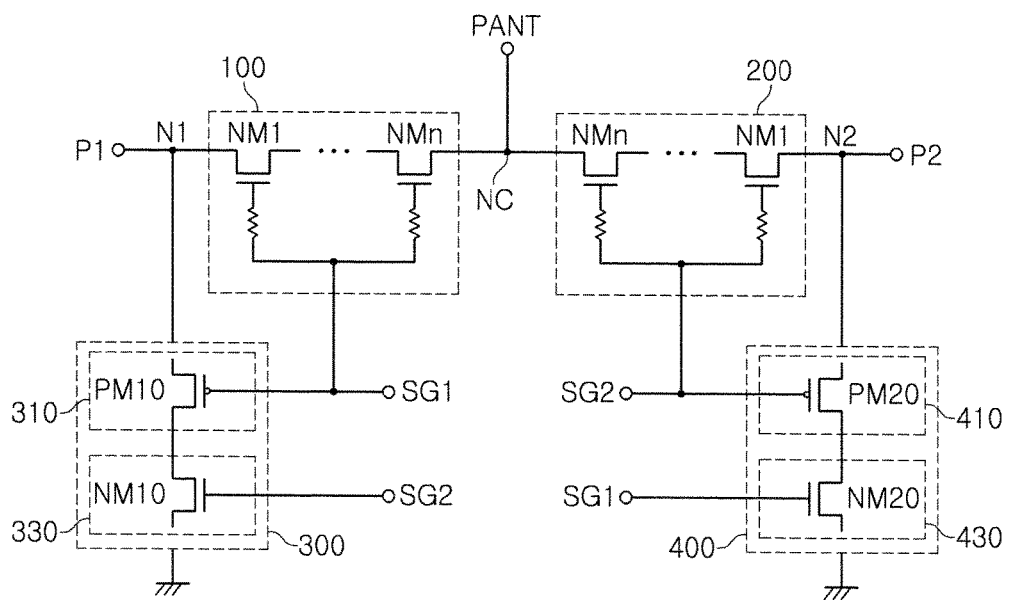
FIG. 2 is a diagram showing a configuration of a radio frequency switch circuit according to a second embodiment of the present disclosure.

FIG. 2 is a diagram showing a configuration of a radio frequency switch circuit according to a second embodiment of the present disclosure.

Referring to FIG. 2, a radio frequency switch circuit according to the second embodiment of the present disclosure may include a first switch circuit unit 100, a second switch circuit unit 200, a first shunt circuit unit 300, and a second shunt circuit unit 400.

A description for the same operations as the operations described with reference to FIG. 1 among operations of the first switch circuit unit 100, the second switch circuit unit 200, the first shunt circuit unit 300, and the second shunt circuit unit 400 shown in FIG. 2 will be omitted in order to avoid an overlapped description.

The first shunt circuit unit 300 may include first and second shunt units 310 and 330 connected to each other in series between the first connection node N1 and the ground, wherein the first shunt unit 310 may be operated by the first gate signal SG1 and the second shunt unit 330 may be operated by the second gate signal SG2.

Here, each of the first and second shunt units 310 and 330 may be in a turned-off state when the first switch circuit unit 100 is in a turned-on state and may be in a turned-on state when the first switch circuit unit 100 is in a turned-off state. The above-mentioned description may be applied to radio frequency switch circuits according to each exemplary embodiment in the present disclosure.

The second shunt circuit unit 400 may include third and fourth shunt units 410 and 430 connected to each other in series between the second connection node N2 and the ground, wherein the third shunt unit 410 may be operated by the second gate signal SG2 and the fourth shunt unit 430 may be operated by the first gate signal SG1.

Here, each of the third and fourth shunt units 410 and 430 may be in a turned-off state when the second switch circuit unit 200 is in a turned-on state and may be in a turned-on state when the second switch circuit unit 200 is in a turned-off state.

For example, the third shunt unit 410 may include at least one PMOS transistor PM20 connected between the second connection node N2 and the fourth shunt unit 430 and receiving the second gate signal SG2.

The fourth shunt unit 430 of the second shunt circuit unit 400 may include at least one NMOS transistor NM20 connected between the third shunt unit 410 and the ground and receiving the first gate signal SG1.

As another example, the fourth shunt unit 430 may include at least one NMOS transistor NM20 connected between the second connection node N2 and the third shunt unit 410 and receiving the first gate signal SG1.

The third shunt unit 410 may include at least one PMOS transistor PM20 connected between the fourth shunt unit 430 and the ground and receiving the second gate signal SG2.

Figure 3:
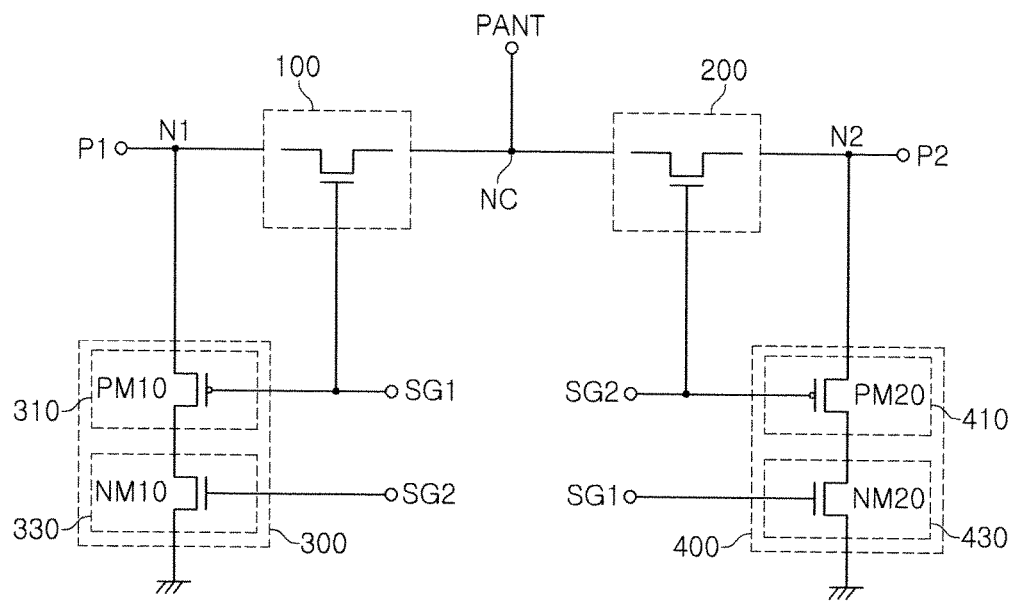
FIG. 3 is a diagram showing a configuration of a radio frequency switch circuit according to a third embodiment of the present disclosure.

FIG. 3 is a diagram showing a configuration of a radio frequency switch circuit according to a third embodiment of the present disclosure.

A description for the same operations as the operations described with reference to FIG. 2 among operations of the first switch circuit unit 100, the second switch circuit unit 200, the first shunt circuit unit 300, and the second shunt circuit unit 400 shown in FIG. 3 will be omitted in order to avoid an overlapped description.

Referring to FIG. 3, the first shunt unit 310 may include at least one PMOS transistor PM10 connected between the first connection node N1 and the second shunt unit 330 and receiving the first gate signal SG1.

The second shunt unit 330 may include at least one NMOS transistor NM10 connected between the first shunt unit 310 and the ground and receiving the second gate signal SG2.

In addition, the third shunt unit 410 may include at least one PMOS transistor PM20 connected between the second connection node N2 and the fourth shunt unit 430 and receiving the second gate signal SG2.

The fourth shunt unit 430 may include at least one NMOS transistor NM20 connected between the third shunt unit 410 and the ground and receiving the first gate signal SG1.

Figure 4:
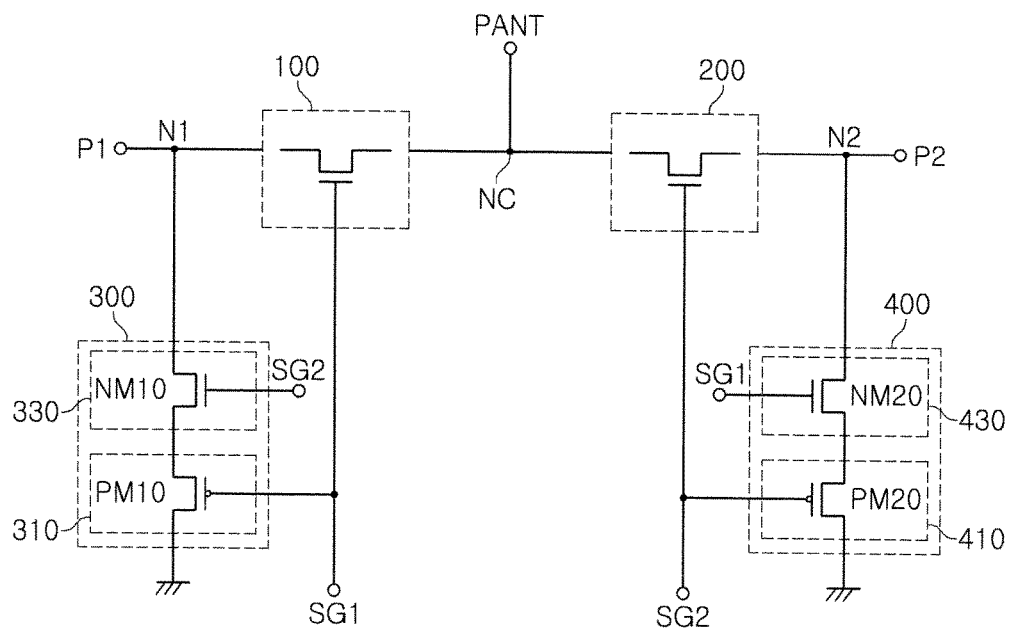
FIG. 4 is a diagram showing a configuration of a radio frequency switch circuit according to a fourth embodiment in the present disclosure.

FIG. 4 is a diagram showing a configuration of a radio frequency switch circuit according to a fourth embodiment of the present disclosure.

A description for the same operations as the operations described with reference to FIG. 2 among operations of the first switch circuit unit 100, the second switch circuit unit 200, the first shunt circuit unit 300, and the second shunt circuit unit 400 shown in FIG. 4 will be omitted in order to avoid an overlapped description.

Referring to FIG. 4, the second shunt unit 330 may include at least one NMOS transistor NM10 connected between the first connection node N1 and the first shunt unit 310 and receiving the second gate signal SG2.

The first shunt unit 310 may include at least one PMOS transistor PM10 connected between the second shunt unit 330 and the ground and receiving the first gate signal SG1.

In addition, the fourth shunt unit 430 may include at least one NMOS transistor NM20 connected between the second connection node N2 and the third shunt unit 410 and receiving the first gate signal SG1.

The third shunt unit 410 may include at least one PMOS transistor PM20 connected between the fourth shunt unit 430 and the ground and receiving the second gate signal SG2.

Also in the radio frequency switch circuit as shown in FIG. 4, each of the first and second shunt units 310 and 330 may be in a turned-off state when the first switch circuit unit 100 is in a turned-on state and may be in a turned-on state when the first switch circuit unit 100 is in a turned-off state.

In addition, each of the third and fourth shunt units 410 and 430 may be in a turned-off state when the second switch circuit unit 200 is in a turned-on state and may be in a turned-on state when the second switch circuit unit 200 is in a turned-off state.

Figure 5:
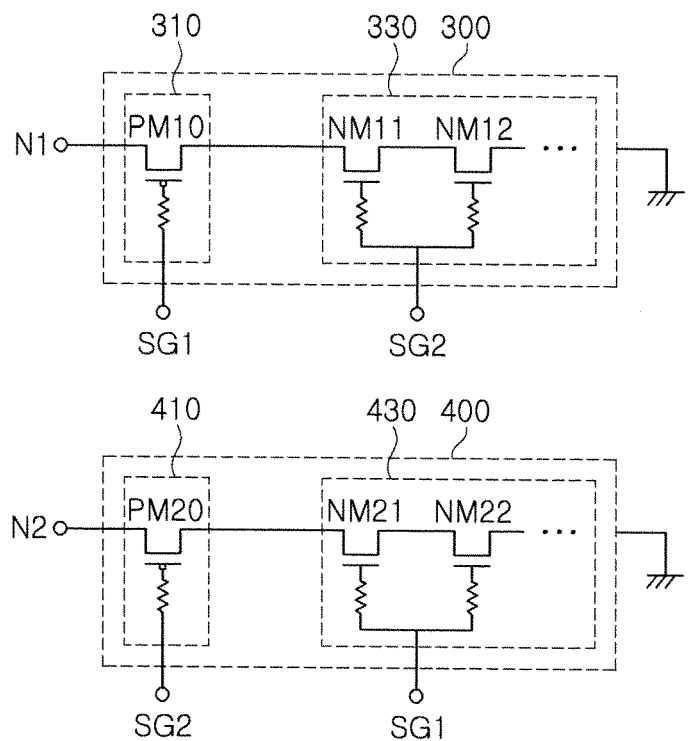
FIG. 5 is a diagram showing a shunt circuit unit according to a fifth embodiment of the present disclosure.

FIG. 5 is a diagram showing a shunt circuit unit according to a fifth embodiment of the present disclosure.

Referring to FIG. 5, for example, the first shunt unit 310 may include one PMOS transistor PM10 receiving the first gate signal SG1. The second shunt unit 330 may include at least two NMOS transistors NM11 and NM12 receiving the second gate signal SG2.

In addition, for example, the third shunt unit 410 may include one PMOS transistor PM20 receiving the second gate signal SG2. The fourth shunt unit 430 may include at least two NMOS transistors NM21 and NM22 receiving the first gate signal SG1.

For example, with respect to the number of stacked transistors of one shunt circuit unit, in the case in which the shunt circuit unit has signal power of 24V as a peak voltage Vpeak in an output of 35 dBm, the number of stacked NMOS transistors should be eight in order to appropriately disperse a voltage in consideration of a breakdown voltage (for example, 3.5V) of the NMOS transistor.

On the other hand, in the case in which the shunt circuit unit includes one PMOS transistor having a breakdown voltage of 5.5V, the number of stacked NMOS transistors may be six. Therefore, a total number of stacked transistors included in one shunt circuit unit may be decreased, such that signal loss may be decreased by the number of stacked transistors.

Figure 6:
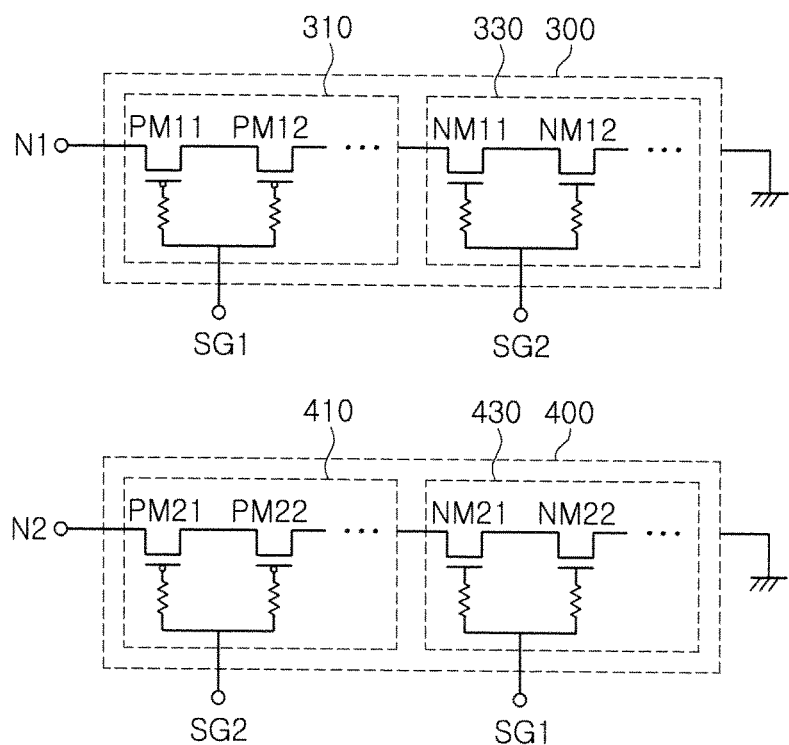
FIG. 6 is a diagram showing a shunt circuit unit according to a sixth embodiment of the present disclosure.

FIG. 6 is a diagram showing a shunt circuit unit according to a sixth embodiment of the present disclosure.

Referring to FIG. 6, for example, the first shunt unit 310 may include at least two PMOS transistors PM11 and PM12 receiving the first gate signal SG1. The second shunt unit 330 may include at least two NMOS transistors NM21 and NM22 receiving the second gate signal SG2.

In addition, for example, the third shunt unit 410 may include at least two PMOS transistors PM21 and PM22 receiving the second gate signal SG2. The fourth shunt unit 430 may include at least two NMOS transistors NM21 and NM22 receiving the first gate signal SG1.

For example, with respect to the number of stacked transistors of one shunt circuit unit, in the case in which the shunt circuit unit has signal power of 24V as a peak voltage Vpeak in an output of 35 dBm, when the shunt circuit unit includes two PMOS transistors having a breakdown voltage of 5.5V, the number of stacked NMOS transistors may be four. Therefore, a total number of stacked transistors included in one shunt circuit unit may be decreased, such that signal loss may be decreased by the number of stacked transistors.

In a radio frequency switch circuit according to another exemplary embodiment in the present disclosure, at least one of the first and second switch circuit units may include the first and second shunt units.

For example, the second switch circuit unit may include the first and second shunt units connected to each other in series between the second signal port for transmitting and receiving a signal and the common connection node. Here, the first shunt unit of the second switch circuit unit may be operated by the second gate signal, and the second shunt unit of the second switch circuit unit may be operated by the first gate signal.

For example, the first shunt unit of the second switch circuit unit may include at least one NMOS transistor connected between the second connection node and the second shunt unit and receiving the second gate signal.

The second shunt unit of the second switch circuit unit may include at least one PMOS transistor connected between the first shunt unit of the second switch circuit unit and the common connection node and receiving the first gate signal.

Figure 7:
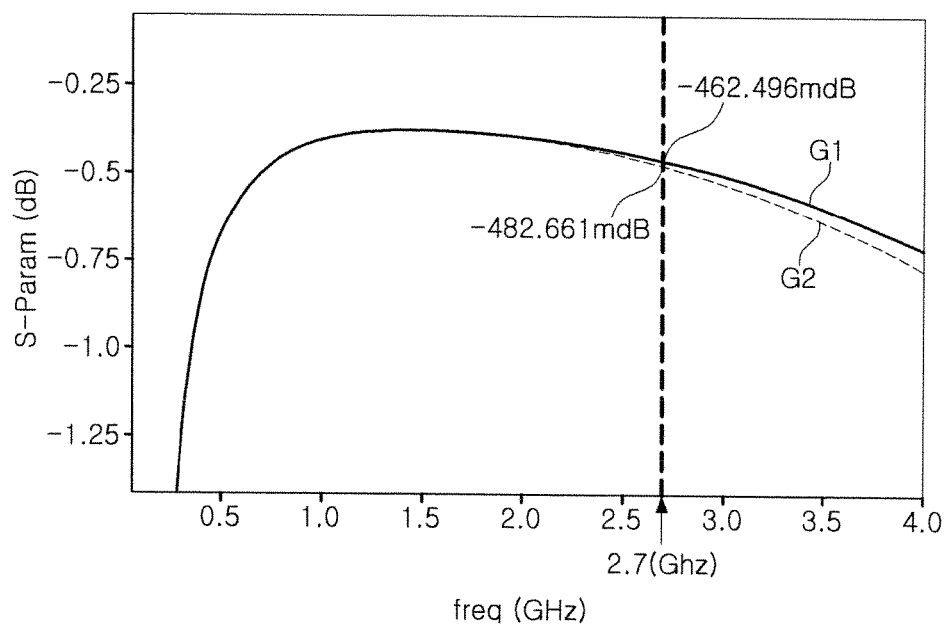
FIG. 7 is a graph showing isolation characteristics of a radio frequency switch circuit according to a seventh embodiment in the present disclosure.

FIG. 7 is a graph showing isolation characteristics of a radio frequency switch circuit according to a seventh embodiment of the present disclosure.

In FIG. 7, G1 is a graph showing isolation characteristics of a radio frequency switch circuit in which a shunt circuit unit includes eight NMOS transistors, and G2 is a graph showing isolation characteristics of a radio frequency switch circuit according to an exemplary embodiment in the present disclosure in which a shunt circuit unit includes one PMOS transistor and six NMOS transistors.

Referring to G1 and G2 shown in FIG. 7, it may be appreciated that loss of the shunt circuit unit may be decreased by decreasing the number of stacked transistors using the PMOS transistor that may increase a breakdown voltage and isolation characteristics of the radio frequency switch circuit according to the related art and the radio frequency switch circuit according to an exemplary embodiment in the present disclosure are substantially the same as each other.

Particularly, at a frequency of 2.7 GHz, isolation characteristics of the radio frequency switch circuit according to the related art were −482.661 mdB, and isolation characteristics of the radio frequency switch circuit according to an exemplary embodiment in the present disclosure were −462.496 mdB. Therefore, it may be appreciated that a difference in simulation between the isolation characteristics of the radio frequency switch circuit according to the related art and the isolation characteristics of the radio frequency switch circuit according to an exemplary embodiment in the present disclosure is not substantially present.

As set forth above, according to exemplary embodiments in the present disclosure, in the radio frequency switch circuit, the number of stacked semiconductor switches in the shunt circuit unit is decreased, whereby the signal loss may be decreased.

While exemplary embodiments have been shown and described above, it will be apparent to those skilled in the art that modifications and variations could be made without departing from the scope of the present invention as defined by the appended claims.

What is claimed is:

1. A radio frequency switch circuit comprising:
a first switch circuit unit connected between a first signal port for transmitting and receiving a signal and a common connection node connected to an antenna port and operated by a first gate signal;
a second switch circuit unit connected between a second signal port for transmitting and receiving a signal and the common connection node and operated by a second gate signal;
a first shunt circuit unit including first and second shunt units connected to each other in series between a first connection node connected to the first signal port and a ground, the first shunt unit and second shunt unit including at least one metal oxide semiconductor (MOS) transistor of different type, respectively, the first shunt unit being operated by the first gate signal having a level different from that of the second gate signal and the second shunt unit being operated by the second gate signal having a level different from that of the first gate signal; and
a second shunt circuit unit connected between a second connection node connected to the second signal port and the ground and operated by the first gate signal,
wherein the first and second shunt units are in a turned-off state when the first switch circuit unit is in a turned-on state and the first and second shunt units are in a turned-on state when the first switch circuit unit is in a turned-off state.

2. The radio frequency switch circuit of claim 1, wherein the first switch circuit unit includes a plurality of N-channel metal oxide semiconductor (NMOS) transistors connected to each other in series between the first signal port and the common connection node and receiving the first gate signal, and the second switch circuit unit includes a plurality of NMOS transistors connected to each other in series between the second signal port and the common connection node and receiving the second gate signal.

3. The radio frequency switch circuit of claim 1, wherein the first shunt unit includes at least one P-channel MOS (PMOS) transistor connected between the first connection node and the second shunt unit and receiving the first gate signal, and the second shunt unit of the first shunt circuit unit includes at least one NMOS transistor connected between the first shunt unit and the ground and receiving the second gate signal.

4. The radio frequency switch circuit of claim 1, wherein the second shunt unit includes at least one NMOS transistor connected between the first connection node and the first shunt unit and receiving the second gate signal, and the first shunt unit includes at least one PMOS transistor connected between the second shunt unit and the ground and receiving the first gate signal.

5. A radio frequency switch circuit comprising:
a first switch circuit unit connected between a first signal port for transmitting and receiving a signal and a common connection node connected to an antenna port and operated by a first gate signal;
a second switch circuit unit connected between a second signal port for transmitting and receiving a signal and the common connection node and operated by a second gate signal;
a first shunt circuit unit including first and second shunt units connected to each other in series between a first connection node connected to the first signal port and a ground, the first shunt unit and second shunt unit including at least one metal oxide semiconductor (MOS) transistor of different type, respectively, the first shunt unit being operated by the first gate signal having a level different from that of the second gate signal and the second shunt unit being operated by the second gate signal having a level different from that of the first gate signal; and
a second shunt circuit unit including third and fourth shunt units connected to each other in series between a second connection node connected to the second signal port and the ground, the third shunt unit and fourth shunt unit including at least one metal oxide semiconductor (MOS) transistor of different type, respectively, the third shunt unit being operated by the second gate signal having a level different from that of the first gate signal and the fourth shunt unit being operated by the first gate signal having a level different from that of the second signal,
wherein the first and second shunt units are in a turned-off state when the first switch circuit unit is in a turned-on state and the first and second shunt units are in a turned-on state when the first switch circuit unit is in a turned-off state, and the third and fourth shunt units are in a turned-off state when the second switch circuit unit is in a turned-on state and the third and fourth shunt units are in a turned-on state when the second switch circuit unit is in a turned-off state.

6. The radio frequency switch circuit of claim 5, wherein the first switch circuit unit includes a plurality of NMOS transistors connected to each other in series between the first signal port and the common connection node and receiving the first gate signal, and the second switch circuit unit includes a plurality of NMOS transistors connected to each other in series between the second signal port and the common connection node and receiving the second gate signal.

7. The radio frequency switch circuit of claim 5, wherein the first shunt unit includes at least one PMOS transistor connected between the first connection node and the second shunt unit and receiving the first gate signal, and the second shunt unit includes at least one NMOS transistor connected between the first shunt unit and the ground and receiving the second gate signal.

8. The radio frequency switch circuit of claim 5, wherein the third shunt unit includes at least one PMOS transistor connected between the second connection node and the fourth shunt unit and receiving the second gate signal, and the fourth shunt unit includes at least one NMOS transistor connected between the third shunt unit and the ground and receiving the first gate signal.

9. The radio frequency switch circuit of claim 5, wherein the second shunt unit includes at least one NMOS transistor connected between the first connection node and the first shunt unit and receiving the second gate signal, and the first shunt unit includes at least one PMOS transistor connected between the second shunt unit and the ground and receiving the first gate signal.

10. The radio frequency switch circuit of claim 5, wherein the fourth shunt unit includes at least one NMOS transistor connected between the second connection node and the third shunt unit and receiving the first gate signal, and the third shunt unit includes at least one PMOS transistor connected between the fourth shunt unit and the ground and receiving the second gate signal.

11. A radio frequency switch circuit comprising:
a first switch circuit unit including a plurality of NMOS transistors connected to each other in series between a first signal port for transmitting and receiving a signal and a common connection node connected to an antenna port and operated by a first gate signal;
a second switch circuit unit including a plurality of NMOS transistors connected to each other in series between a second signal port for transmitting and receiving a signal and the common connection node and operated by a second gate signal;
a first shunt circuit unit including first and second shunt units connected to each other in series between a first connection node connected to the first signal port and a ground, the first shunt unit including at least one PMOS transistor operated by the first gate signal having a level different from that of the second signal and the second shunt unit including at least one NMOS transistor operated by the second gate signal having a level different from that of the first gate signal; and
a second shunt circuit unit including third and fourth shunt units connected to each other in series between a second connection node connected to the second signal port and the ground, the third shunt unit including at least one PMOS transistor operated by the second gate signal having a level different from that of the first gate signal and the fourth shunt unit including at least one NMOS transistor operated by the first gate signal having a level different from that of the second gate signal, wherein the first and second shunt units are in a turned-off state when the first switch circuit unit is in a turned-on state and the first and second shunt units are in a turned-on state when the first switch circuit unit is in a turned-off state, and the third and fourth shunt units are in a turned-off state when the second switch circuit unit is in a turned-on state and the third and fourth shunt units are in a turned-on state when the second switch circuit unit is in a turned-off state.

12. The radio frequency switch circuit of claim 11, wherein the first shunt unit is connected between the first connection node and the second shunt unit and receives the first gate signal, and the second shunt unit is connected between the first shunt unit and the ground and receives the second gate signal.

13. The radio frequency switch circuit of claim 11, wherein the third shunt unit is connected between the second connection node and the fourth shunt unit and receives the second gate signal, and the fourth shunt unit is connected between the third shunt unit and the ground and receives the first gate signal.

14. The radio frequency switch circuit of claim 11, wherein the second shunt unit is connected between the first connection node and the first shunt unit and receives the second gate signal, and the first shunt unit is connected between the second shunt unit and the ground and receives the first gate signal.

15. The radio frequency switch circuit of claim 11, wherein the fourth shunt unit is connected between the second connection node and the third shunt unit and receives the first gate signal, and the third shunt unit is connected between the fourth shunt unit and the ground and receives the second gate signal.

* * * * *